United States Patent
Baeckler et al.

(10) Patent No.: US 8,661,380 B1
(45) Date of Patent: Feb. 25, 2014

(54) METHOD AND APPARATUS FOR PERFORMING PARALLEL SYNTHESIS ON A FIELD PROGRAMMABLE GATE ARRAY

(75) Inventors: Gregg William Baeckler, San Jose, CA (US); Babette Van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 1049 days.

(21) Appl. No.: 12/070,478

(22) Filed: Feb. 19, 2008

(51) Int. Cl.
*G06F 17/50* (2006.01)

(52) U.S. Cl.
USPC ............................................. 716/104

(58) Field of Classification Search
USPC ............................................. 716/104
See application file for complete search history.

(56) References Cited

U.S. PATENT DOCUMENTS

| | | | | |
|---|---|---|---|---|
| 6,484,292 B1* | 11/2002 | Jain et al. | ...................... | 716/104 |
| 7,171,633 B1* | 1/2007 | Hwang et al. | ................. | 716/103 |
| 7,254,801 B1* | 8/2007 | Borer et al. | ................... | 716/117 |
| 7,519,938 B1* | 4/2009 | Shortt et al. | .................. | 716/104 |
| 2003/0023941 A1* | 1/2003 | Wang et al. | ...................... | 716/4 |
| 2004/0068331 A1* | 4/2004 | Cronquist | ....................... | 700/18 |
| 2004/0221249 A1* | 11/2004 | Lahner et al. | ..................... | 716/4 |
| 2007/0006111 A1* | 1/2007 | Otsuka | ........................... | 716/13 |
| 2007/0113127 A1* | 5/2007 | Nonaka | ......................... | 714/724 |
| 2008/0201128 A1* | 8/2008 | Baumgartner et al. | ......... | 703/15 |

\* cited by examiner

Primary Examiner — Vuthe Siek
Assistant Examiner — Aric Lin
(74) Attorney, Agent, or Firm — L. Cho

(57) ABSTRACT

A method for designing a system to be implemented on a target device includes performing a first synthesis run on an entire design of a system with a first setting to generate a first cell netlist for the entire design of the system. A second synthesis run is performed on the entire design for the system with a second setting and is performed in parallel with the first synthesis procedure to generate a second cell netlist for the entire design of the system. A merged cell netlist is generated that includes a first section of logic from the first netlist and a second section of logic from the second cell netlist.

37 Claims, 14 Drawing Sheets

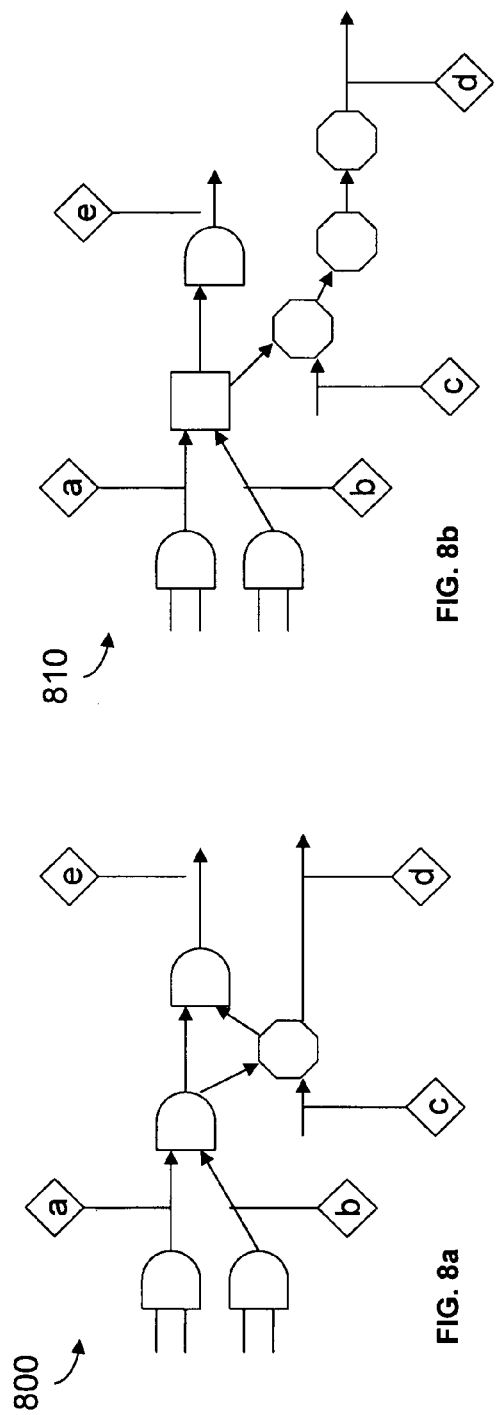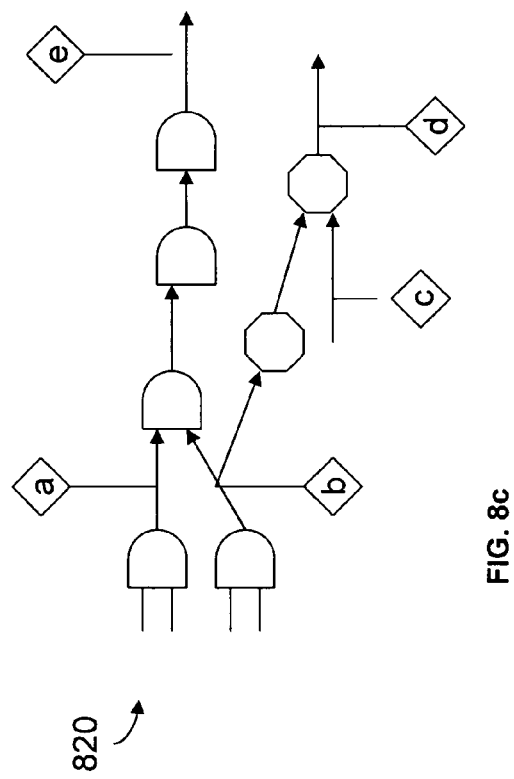
FIG. 8a
FIG. 8b
FIG. 8c

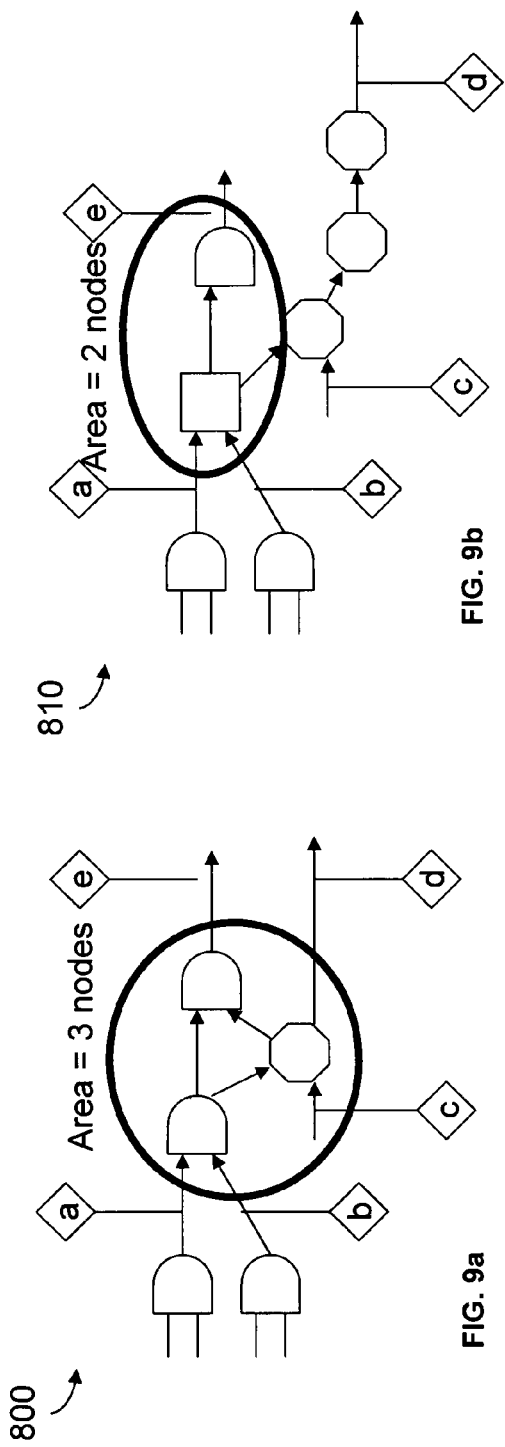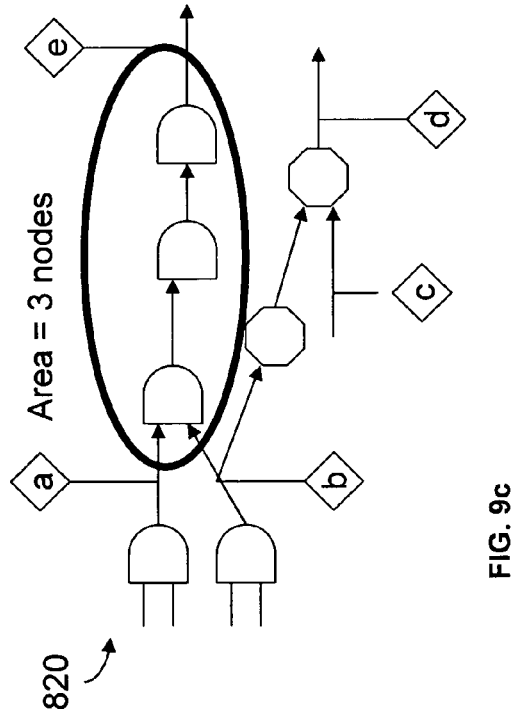
FIG. 9a
FIG. 9b
FIG. 9c

US 8,661,380 B1

METHOD AND APPARATUS FOR PERFORMING PARALLEL SYNTHESIS ON A FIELD PROGRAMMABLE GATE ARRAY

TECHNICAL FIELD

Embodiments of the present invention relate to tools such as electronic design automation (EDA) tools for designing systems on target devices such as field programmable gate arrays (FPGAs). More specifically, embodiments of the present invention relate to a method and apparatus for performing parallel synthesis on a design for a system.

BACKGROUND

Logic devices such as FPGAs are used to implement large systems that may include million of gates and megabits of embedded memory. The complexity of large systems often requires the use of EDA tools to create and optimize a design for the system onto physical target devices. Among the procedures performed by EDA tools in a computer aided design (CAD) flow are synthesis, placement, and routing.

During synthesis, a designer inputs a description of the system into the EDA tool. The EDA tool may perform synthesis procedures such as extraction, logic minimization, and technology mapping on the description of the system and produce a cell netlist. The EDA tool may be configured with various settings for the extraction, logic minimization, and technology mapping procedures. For example, for logic minimization, a designer may select a setting that directs the EDA tool to choose one of many state machine encoding methods. For technology mapping, a designer may select a setting that directs the EDA tool to honor or to ignore classes of user buffers. These selections may affect the area and speed of portions of the system. An EDA tool may have thousands of such settings that may be programmed by a designer.

Typically, certain portions of a system may work better with certain EDA tool settings than with others. When programmed, settings are applied to the entire design and the benefits of a selected setting is often not known until after synthesis is performed on the system.

SUMMARY

According to an embodiment of the present invention, observer logic is inserted onto a design for a system. The observer logic may identify sections of logic and operate to provide a bounded region for logic. A plurality of synthesis runs are executed on the identical design of the system having observer logic at the same locations. The synthesis runs may be performed in parallel on separate processors, processor cores, and/or computer systems. The cell netlist generated from the synthesis runs are analyzed to determine the quality of each section of logic associated with an observer logic. The quality of a section of logic may be based on its required size, speed for signal propagation, utilization of wire resources, and/or other criteria. A merged cell netlist may be created by combining the sections of logic associated with observer logic having the best quality. One or more observer logic may be used to identify functionally equivalent sections of logic among cell netlists.

BRIEF DESCRIPTION OF THE DRAWINGS

The features and advantages of the present invention are illustrated by way of example and are by no means intended to limit the scope of the present invention to the particular embodiments shown.

FIGS. 8a-8c illustrate an example of synthesis results according to an embodiment of the present invention.

FIGS. 9a-9c illustrate an example of analysis performed on a first section of logic according to an embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
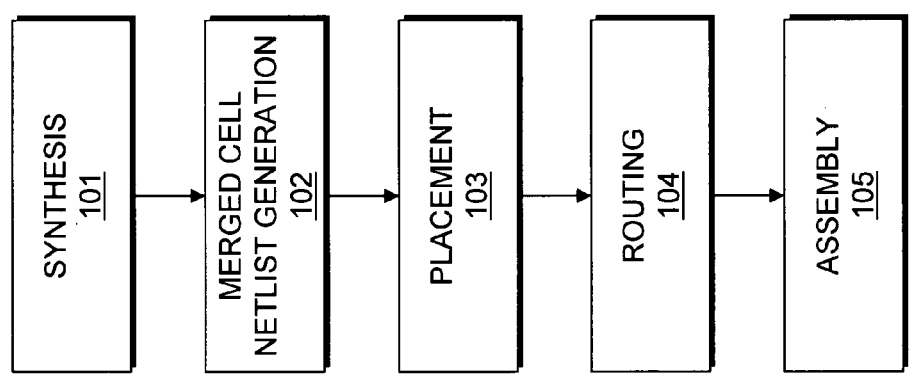
FIG. 1 is a flow chart illustrating a method for designing a system on target devices according to an exemplary embodiment of the present invention.

FIG. 1 is a flow chart illustrating a method for designing a system on a target device according to an embodiment of the present invention. The procedure shown in FIG. 1 may be performed by an EDA tool such as a system designer implemented on a computer system. At 101, synthesis is performed on a design of a system. According to an embodiment of the present invention, synthesis generates an optimized logical representation of the system from a HDL design definition. The optimized logical representation of the system may include a representation that has a minimized number of functional blocks such as logic gates, logic elements, and registers required for the system. Technology mapping is also performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist (cell netlist) is generated from the HDL.

According to an embodiment of the present invention, a plurality of synthesis runs may be performed on the design of the system. The synthesis runs may be performed in parallel using a plurality of processors, processor cores, or computer systems, or the synthesis runs may be performed serially. In this embodiment, observer logic may be inserted at the initial stage of synthesis to mark and identify sections of logic and operate to provide a bounded region for the logic. The observer logic may be used to identify functionally equivalent sections of logic among cell netlists generated by the plurality of synthesis runs. Different settings may be programmed for the synthesis procedures in each synthesis run in order to generate unique cell netlists.

At 102, a merged cell netlist is generated. According to an embodiment of the present invention, the sections of logic associated with the observer logic of each of the plurality of cell netlists may be analyzed and compared with similar or functionally equivalent sections of logic from other synthesis runs. The sections of logic with the best quality are identified and selected to be included in a merged cell netlist.

At 103, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 104, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 105, an assembly procedure is performed. The assembly procedure involves creating a data file that includes some of the information determined by the procedure described by 101-104. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

Figure 2:
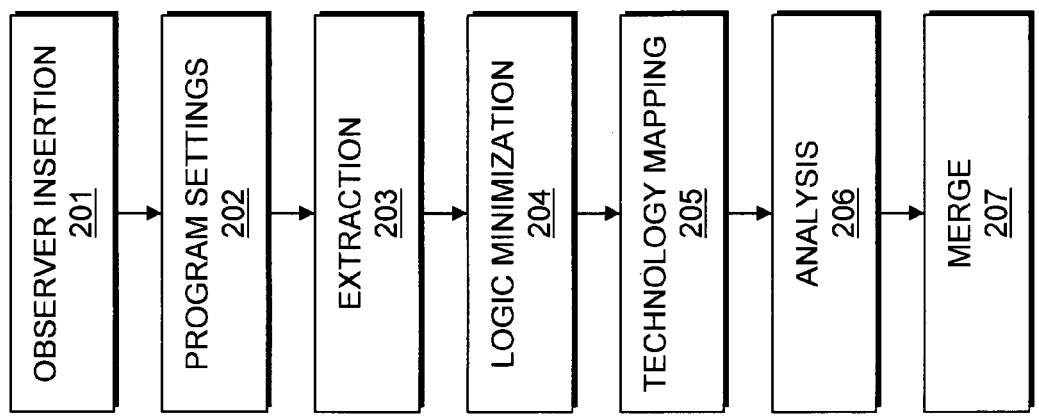
FIG. 2 is a flow chart illustrating a method for performing synthesis and generating a merged cell netlist according to an exemplary embodiment of the present invention.

FIG. 2 is a flow chart illustrating a method for performing synthesis and generating a merged cell netlist according to an exemplary embodiment of the present invention. The procedure illustrated in FIG. 2 may be used to implement procedures 101 and 102 illustrated in FIG. 1. At 201 observer logic is inserted into a design for a system. According to an embodiment of the present invention, the observer logic may be implemented using special logic gates which remain undisturbed during synthesis. The observer logic operates to mark and identify sections of logic. The logic feeding the observer logic may be minimized, refactored, and/or transformed, however the logic will exhibit the same behavior. The observer logic may function as an output pins to provide information about signals at a section of logic. The observer logic may also be numbered for identification. According to an embodiment of the present invention, the observer logic may be implemented as a buffer which is a binary record. The observer does not imply any space requirement on the target device.

At 202, settings for synthesis procedures may be programmed. For the logic minimization procedure, a number of settings may be programmed. For example, the manner in which state machine encoding is performed may be selected, how stuck and duplicate registers are handled, as well as whether register retiming is to be performed may be programmed. For the technology mapping procedure, other settings may be programmed. For example, the classes of user buffers may be set to be honored or ignored, cost functions for lookup table mapping may be set to emphasize a desired result such as speed or area, and conditions may be set to utilize certain "expensive" resources on the device. It should be appreciated that other settings may be programmed for these and other procedures in synthesis.

At 203, extraction is performed on the design for the system. According to an embodiment of the present invention, extraction involves translating a description of the design of the system into a netlist of logic. The translation may be performed on a Verilog or very-high-speed integrated circuit (VHSIC) hardware description language (VHDL) file that includes text. The netlist of logic may include a description of components such as logic gates that may be used to implement the design for the system.

At 204, logic minimization is performed. According to an embodiment of the present invention, logic minimization may involve transforming the netlist of logic into a less complex gate level implementation. The minimized design may include a fewer number of gate inputs, gates, and/or level of logic gates, logic elements, and registers.

At 205, technology mapping is performed. According to an embodiment of the present invention, technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist (cell netlist) is generated.

It should be appreciated that procedures 201-205 may be performed a plurality of times by one or more processors, processor cores, and/or computer systems to execute multiple runs of synthesis on a same design of a system. Each synthesis run may involve programming settings differently in order to generate a unique cell netlist.

At 206, the cell netlists generated at 205 is analyzed. According to an embodiment of the present invention, the sections of logic associated with the observer logic of each of the plurality of cell netlists may be analyzed and assigned a quality factor. The quality factor may be generated based upon a size of a section of logic, the speed in which signals are propagated through the section of logic, the amount of wire required for implementing the section of logic, and/or other criteria.

At 207, a merged cell netlist is generated. According to an embodiment of the present invention, sections of logic in the design for the system are compared with similar sections of logic from other synthesis runs. The sections of logic with the best quality are identified and selected to be included in a merged cell netlist.

Figure 3:
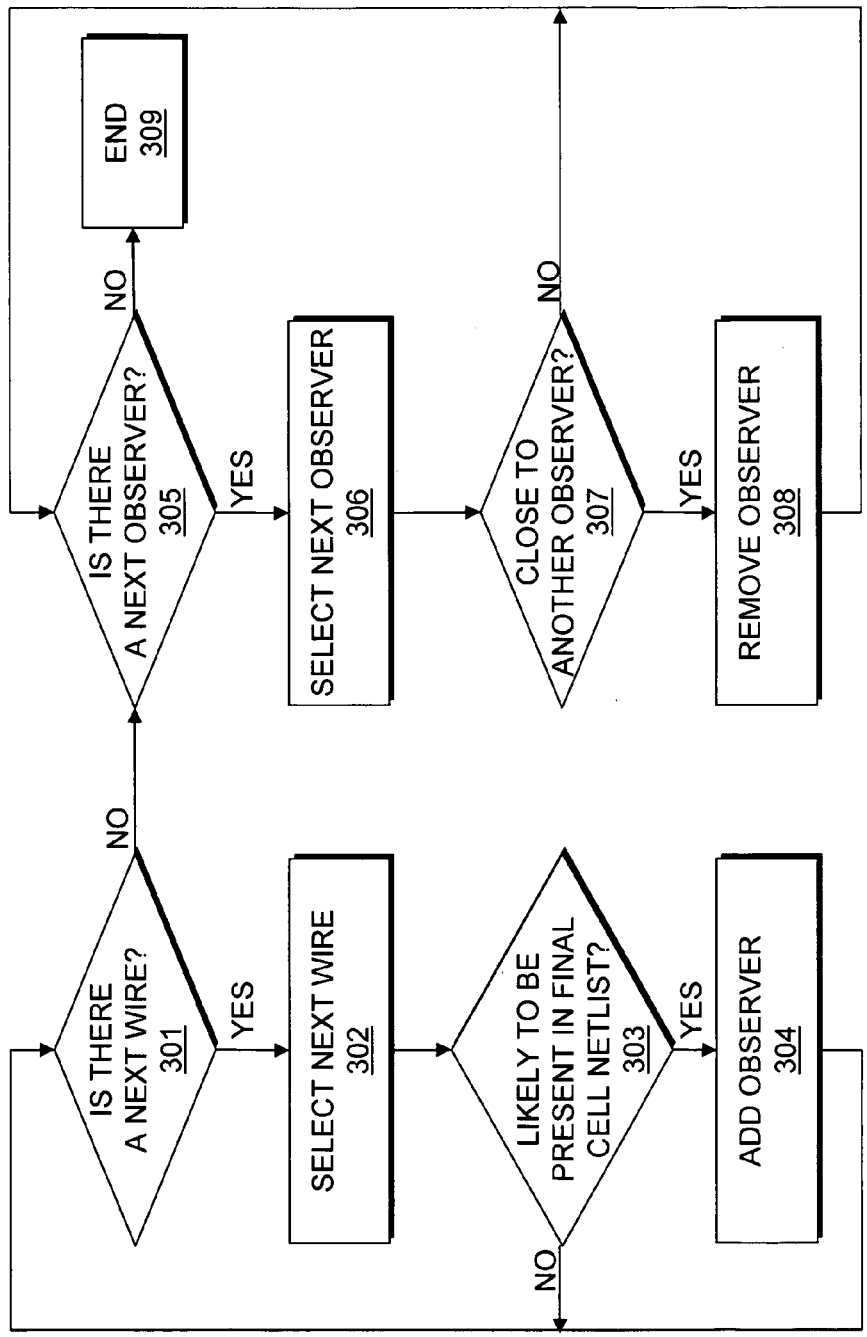
FIG. 3 is a flow chart illustrating a method for performing observer logic insertion according to an exemplary embodiment of the present invention.

FIG. 3 is a flow chart illustrating a method for performing observer logic insertion according to an exemplary embodiment of the present invention. The procedure illustrated in FIG. 3 may be used to implement procedure 201 illustrated in FIG. 2. At 301, it is determined whether a next wire exists in the design of the system that has not been previously examined. If it is determined that a next wire exists in the design of the system that has not been previously examined, control proceeds to 302. If it is determined that all wires have been examined, control proceeds to 305.

At 302, a next wire to be examined is selected.

At 303, it is determined whether the wire is likely to be present in a final cell netlist. According to an embodiment of the present invention, a wire may be likely to be present in a final cell netlist if the wire is coupled to an output of a register, memory, multiplier, or other hard block. If it is determined that the wire is likely to be present in a final cell netlist, control proceeds to 304. If it is determined that the wire is not likely to be present in a final cell netlist, control returns to 301.

At 304, an observer logic is added to the wire.

At 305, it is determined whether a next observer logic exists that has not previously been examined. If a next observer logic exists that has not previously been examined, control proceeds to 306. If a next observer logic does not exist, control proceeds to 309.

At 306, the next observer logic is selected.

At 307, it is determined whether the observer logic selected is within a first predetermined distance of another observer logic. If it is determined that the observer logic is within the first predetermined distance of an other observer logic, the observer logic is determined to be too close and control proceeds to 308. If it is determined that the observer logic is not within the predetermined distance of the other object, control returns to 305.

At 308, the other observer logic is removed.

At 309, control terminates the process.

According to an embodiment of the present invention, an observer logic may be examined to determine a distance of a next observer logic. If the next observer logic exceeds a second predetermined distance, an additional observer logic may be added at the midpoint between the observer logic and the next observer logic.

Figure 4:
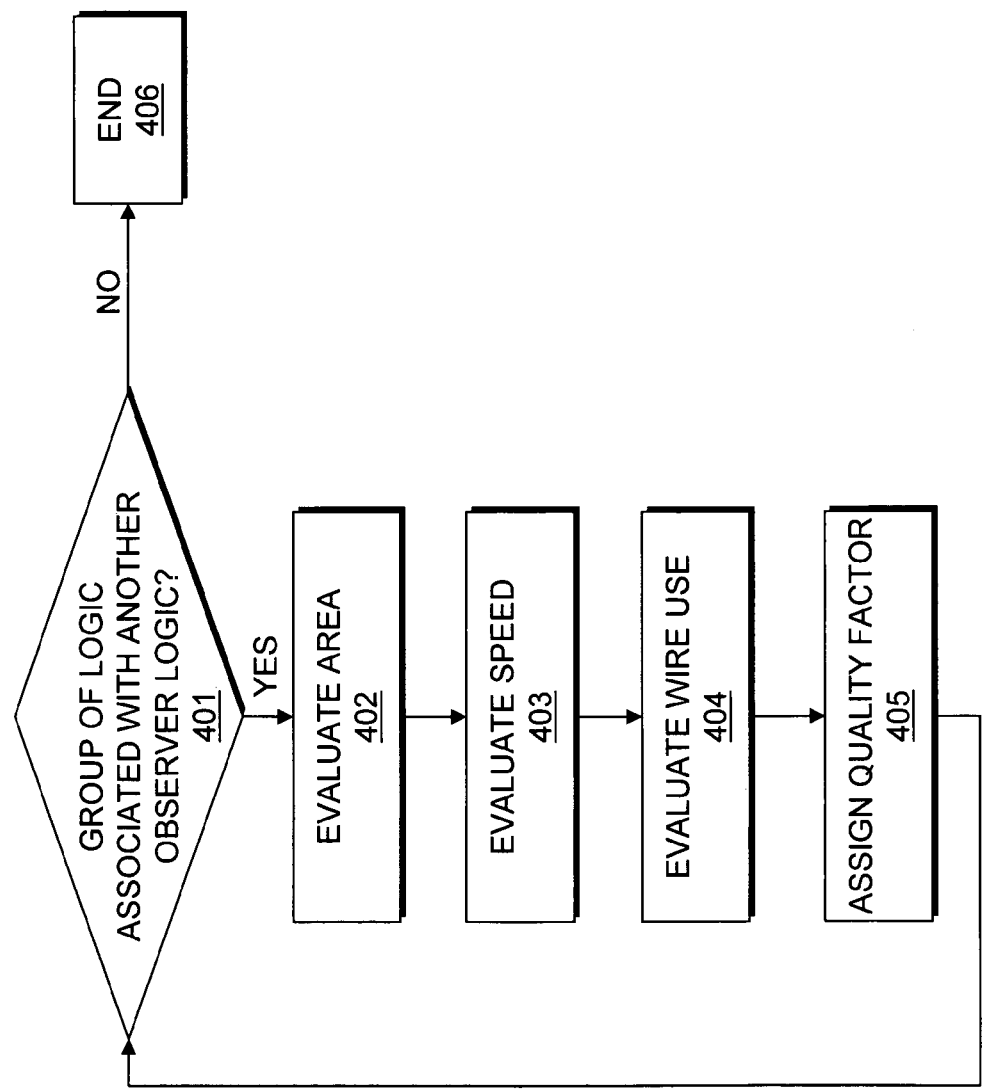
FIG. 4 is a flow chart illustrating a method for analyzing a section of logic according to an exemplary embodiment of the present invention.

FIG. 4 is a flow chart illustrating a method for analyzing a section of logic according to an exemplary embodiment of the present invention. The procedure illustrated at FIG. 4 may be used to implement procedure 206 illustrated in FIG. 2. At 401, it is determined whether another section of logic associated an observer logic exists that has not yet been evaluated. If another section of logic associated with an observation point exists that has not yet been evaluated, control proceeds to 402. If all sections of logic associated with an observer logic has been evaluated, control proceeds to 406.

At 402, the area corresponding to the section of logic is evaluated. According to an embodiment of the present invention, a number of resources required to implement the section of logic is determined.

At 403, the speed of a signal propagating through the section of logic is evaluated. According to an embodiment of the present invention, the maximum or average delay through the section of logic is determined.

At 404, an amount of wire required to implement the section of logic is evaluated. According to an embodiment of present invention, the wire use may be used to estimate the power consumption of the section of logic.

At 405, a quality factor is assigned to the section of logic. According to an embodiment of the present invention, the quality factor may be a function of the characteristics of the logic section as determined in procedures 402-404. It should be appreciated that a designer may prioritize and weight the characteristics of sections of logic so that a quality factor is generated that is indicative of the designer's preferred. It should be further appreciated that other characteristics of the logic section may be evaluated and used to determine its quality factor. For example, the level of observability of a debug signal, the routing topology, or other characteristic may also be evaluated. Control returns to 401.

At 406, control terminates the procedure.

Figure 5:
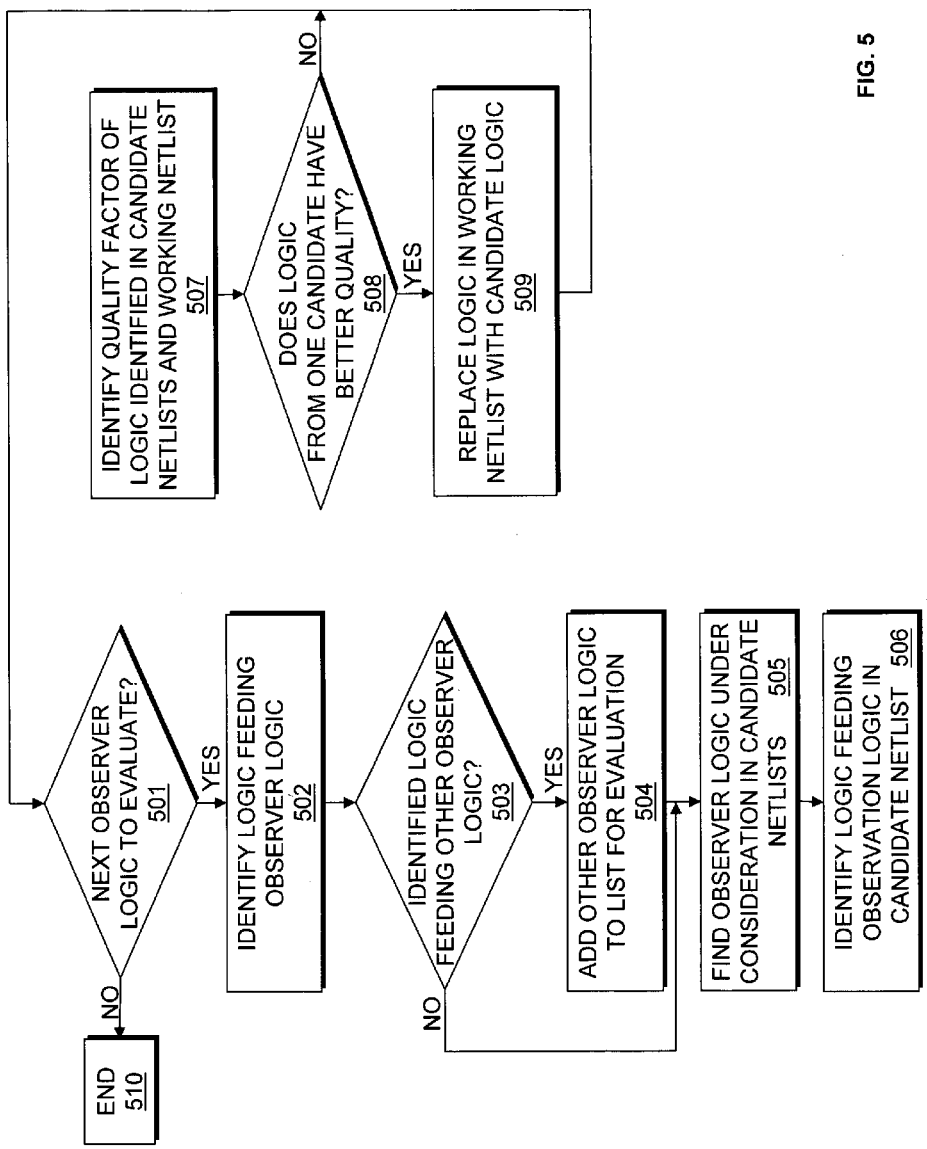
FIG. 5 is a flow chart illustrating a method for generating a merged cell netlist according to an exemplary embodiment of the present invention.

FIG. 5 is a flow chart illustrating a method for generating a merged cell netlist according to an exemplary embodiment of the present invention. The procedure illustrated in FIG. 5 may be used to implement procedure 207 illustrated in FIG. 2. At 501, it is determined whether a next observer logic exists in a working netlist that has not been evaluated. According to an embodiment of the present invention, the working netlist may be one of the cell netlists generated from performing synthesis on a design of a system. If a next observer logic exists that has not been evaluated, control proceeds to 502. If all observer logic have been evaluated, control proceeds to 510.

At 502, logic feeding the observer logic is identified.

At 503, it is determined whether the logic identified at 502 also feeds other observer logic. If the identified logic also feeds other observer logic, control proceeds to 504. If the identified logic does not feed other observer logic, control proceeds to 505.

At 504, the other observer logic identified at 502 is added to a list of observer logic for evaluation.

At 505, the observer logic to be evaluated are identified in candidate netlists. According to an embodiment of the present invention, the candidate netlists may include other cell netlists generated from synthesis runs of the same initial design of the system. In one embodiment, the observer logic may be identified by their corresponding serial numbers.

At 506, logic feeding the observation logic under evaluation are identified in the working netlist and the candidate netlists.

At 507, the quality factor of the logic identified in the working netlist and the candidate netlists are identified.

At 508, it is determined whether logic from one of the candidate netlists has a higher quality factor than the logic from the working netlist. If more than one quality factors are included in the logic, control may sum or average the quality factors and compare the summed or averaged values. If more than one logic from the candidate netlists have a higher quality factor that the logic from the working netlist, the logic with the highest quality factor is identified. If logic from one candidate netlist has a higher quality factor than the logic from the working netlist, control proceeds to 509. If logic from the working netlist has the highest quality factor, control returns to 501.

At 509, the logic in the working netlist is replaced with logic from the candidate netlist having a higher quality factor. Control returns to 501.

At 510, control terminates the procedure.

Figure 6:
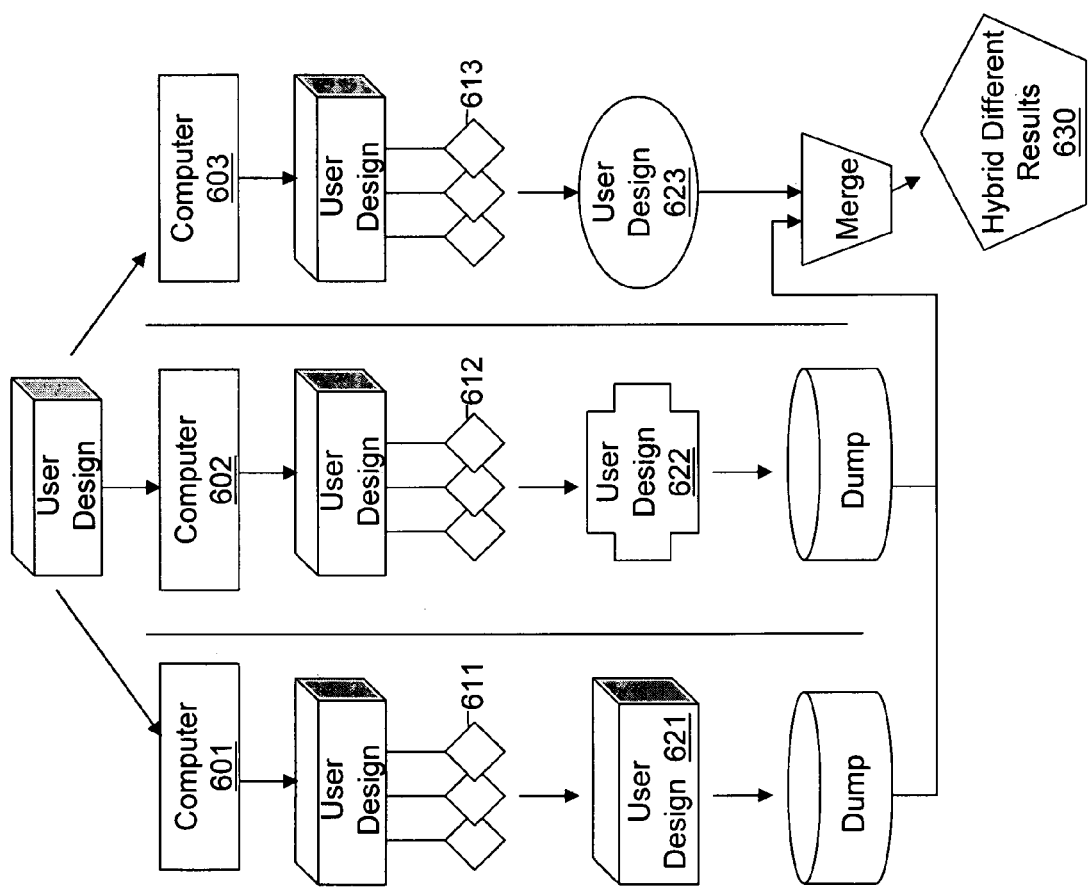
FIG. 6 is a block diagram illustrating a plurality or computer systems performing parallel synthesis according to an example embodiment of the present invention.

FIG. 6 is a block diagram illustrating a network of computer systems 601-603 performing parallel synthesis according to an example embodiment of the present invention. The network of computer systems includes a first computer system 601, a second computer system 602, and an nth computer system 603, where n may be any number. Each of the computer systems may include an EDA tool that may be used to perform synthesis. According to one embodiment, the computer systems run the same EDA CAD software, but have different settings programmed for synthesis. As shown, each of the computer systems 600 receives a copy an identical copy of a design of a system 610.

The computer systems 601-603 add observer logic 611-613, respectively, to the design of the system. The observer logic is inserted at the same location in the design of the system by each of the computer systems 601-603.

As synthesis is performed by each computer system 601-603, the different settings programmed cause a different cell netlist 621-623 to be generated by each of the computer system 601-603. The different settings cause a divergence in the circuit structure of the system. This may affect aspects of quality.

In the embodiment of the present invention shown, all but one of the computer systems transmit the cell netlist generated to disk and terminate the synthesis procedure. The remaining computer system (computer system 603) retrieves the cell netlists from the other computer systems and uses the observer logic to select sections of logic with the best quality to form a merged cell netlist 630 that is a hybrid of all the cell netlists. According to the embodiment shown, computer system 603 analyzes the quality of the cell netlists generated by all of the computer systems 601-603 and generates a quality factor for sections of logic in each of the cell netlists. Alternatively, it should be appreciated that the computer system where a cell netlist originates from may perform the analysis and generate quality factors for sections of logic in its own netlist before transmitting the cell netlist to disk.

As shown in FIG. 6, computer system 601 executes a first synthesis run on the design for the system 600, computer system 602 executes a second synthesis run on the design of the system 600, and computer system 603 executes an nth synthesis run on the design of the system 600. It should be appreciated that instead of having separate computer systems 601 execute separate synthesis runs that separate processors or processor cores may be executing the synthesis runs. The synthesis runs are illustrated in FIG. 6 to be run in parallel. It should be appreciated that the synthesis runs may be run in parallel, in series, or a combination of the two. It should be further appreciated that other forms of memory or network based communication could be used to share cell netlists in addition to disk storage.

Figure 7B:
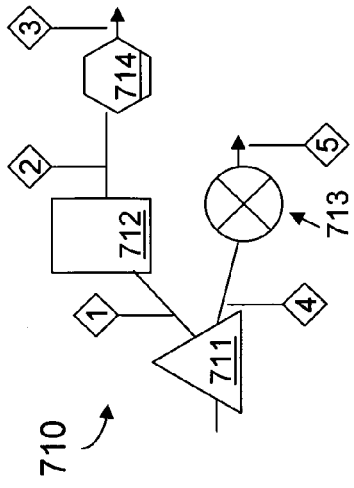
FIGS. 7a-7c illustrate an example of how a merged cell netlist is generated according to a first embodiment of the present invention.
Figure 7C:
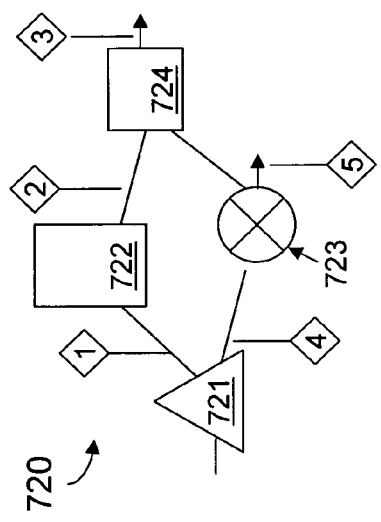
Figure 7A:
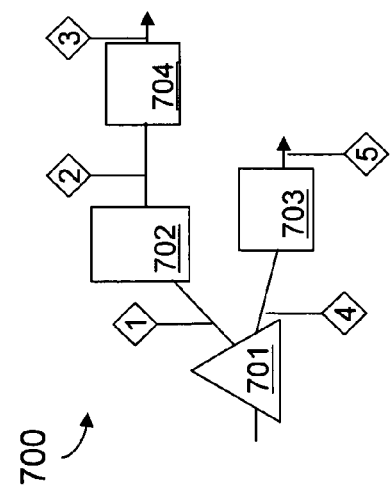

FIGS. 7a-7c illustrate an example of how a merged cell netlist is generated by considering logic directly associated with an observer logic according to an embodiment of the present invention. FIG. 7a illustrates a first circuit 700 resulting from a first synthesis run. As shown, observer logic 1-5 have been inserted into the design of the system. Blocks 701-704 represent resources on a target device (cells) that may be used to implement the design of the system as determined by the first synthesis run.

FIG. 7b illustrates a second circuit resulting from a second synthesis run. As shown, observer logic 1-5 have been inserted into the design of the system. Blocks 711-714 represent resources on a target device (cells) that may be used to implement the design of the system as determined by the second synthesis run. The first and second circuits 700 and 710 are functionality equivalent, but are structurally different. The observer logic 1-4 allows us to assert where points within the circuits are functionally equivalent. As shown, blocks 701 and 711 are both functionally and structurally equivalent, and blocks 702 and 712 are both functionally and structurally equivalent. Blocks 704 and 714 are functionally equivalent, but structurally different. Blocks 703 and 713 are functionally equivalent, but structurally different.

If it is determined that among the inputs to observer logic 3, block 704 has a higher quality factor than 714, then block 704 may be selected for the merged cell netlist. If it is determined that among the inputs to observer 5, that block 713 has a higher quality factor than 703, then block 713 may be selected for the merged cell netlist. FIG. 7c illustrates a third circuit 720 resulting from merging the cell netlist of the first circuit 700 of FIG. 7a and the second circuit 71 of FIG. 7b. The third circuit 720 includes block 721 which is structurally equivalent to block 701 and 711, and block 722 which is structurally equivalent to block 702 and 712. Block 723 is structurally equivalent to block 713 and 724 is structurally equivalent to block 704.

In some instances, it may be beneficial to evaluate the inputs to multiple observer logic together. For example, if logic feeding a first observer logic also feeds a second observer logic, it may also be beneficial to evaluate any additional logic feeding the second observer logic together with the logic feeding the first observer. FIGS. 8a-8c illustrate examples of functionally equivalent synthesis results according to an embodiment of the present invention. FIG. 8a illustrates a first circuit 800 generated from a first synthesis run. FIG. 8b illustrates a second circuit 810 generated from a second synthesis run. FIG. 8c illustrates a third circuit 820 generated from a third synthesis run. Circuits 800, 810, and 830 are functionally equivalent and each include observer logic a-e which identify functionally equivalent sections in the circuit.

Figure 10A:
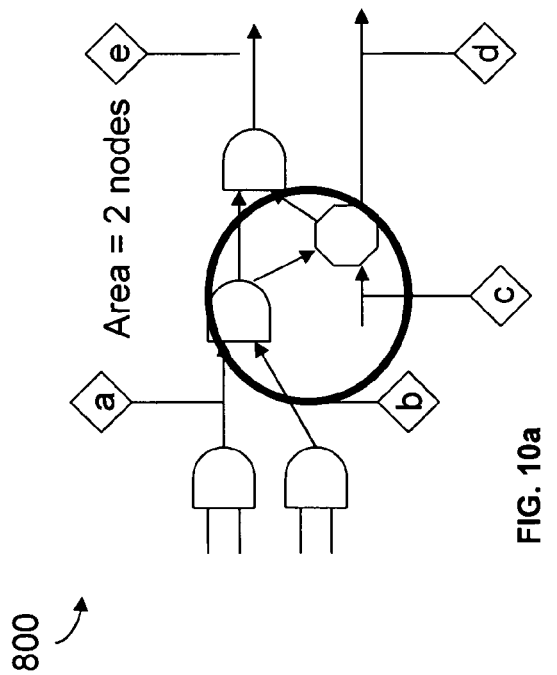
FIGS. 10a-10c illustrate an example of analysis performed on a second section of logic according to an embodiment of the present invention.
Figure 10B:
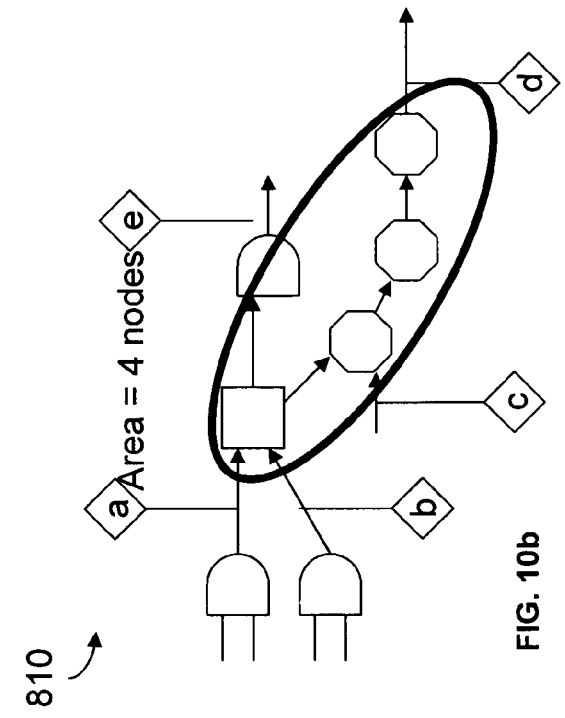
Figure 10C:
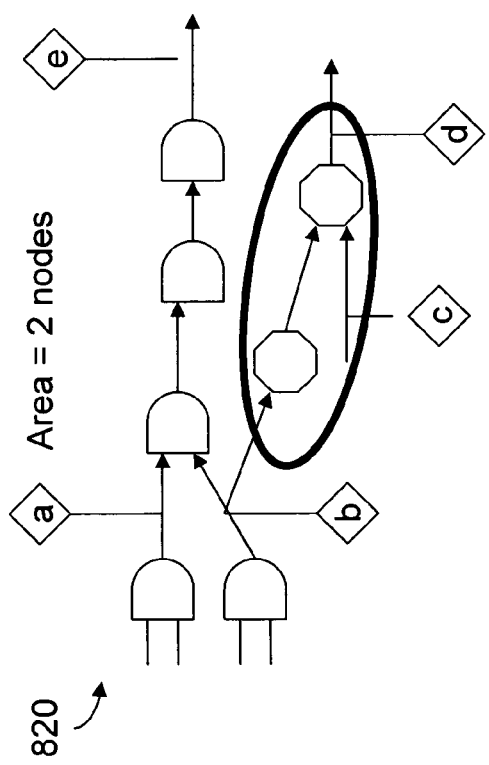

FIGS. 9a-9c, and 10a-10c illustrate an example of how functionally equivalent synthesis results may be analyzed according to an embodiment of the present invention. In this example, the size for implementing circuits 800, 810, and 820 is analyzed by identifying a number of components required to implement logic feeding an observer logic. FIG. 9a illustrates that three components (nodes) feed observer logic e in circuits 800. FIG. 9b illustrates that two components feed observer logic e in circuit 810. FIG. 9c illustrates that three components feed observer logic e in circuit 820. FIG. 10a illustrates that two components (nodes) feed observer logic d in circuit 800. FIG. 10b illustrates that four components feed observer logic d in circuit 810. FIG. 10c illustrates that two components feed observer logic d in circuit 820.

When considering the output independently, it would appear that with respect to area, circuit 810 implements a section of logic that feeds observer e that has the highest quality factor and that circuit 800 implements a section of logic that feeds observer d that has the highest quality factor. If both these solutions were included in a merged netlist, a total of 4 components (nodes) would be implemented. However, note that circuit 800 itself includes a total area of only 3 nodes which is less than the 4 nodes implemented in the merged netlist despite having a higher cost when inputs to observer e was analyzed with respect to FIG. 9a. This illustrates an example where a locally optimized solution is not optimal when viewed together with other solutions. The greedy local solution misses the global optimization. In order to reduce this outcome, logic feeding observers d and e may be considered simultaneously. Observer d and e are good candidates to analyze together because they are fed by common observers on the input size (observers a, b, and c), and share common logic in one or more implementations.

Figure 11:
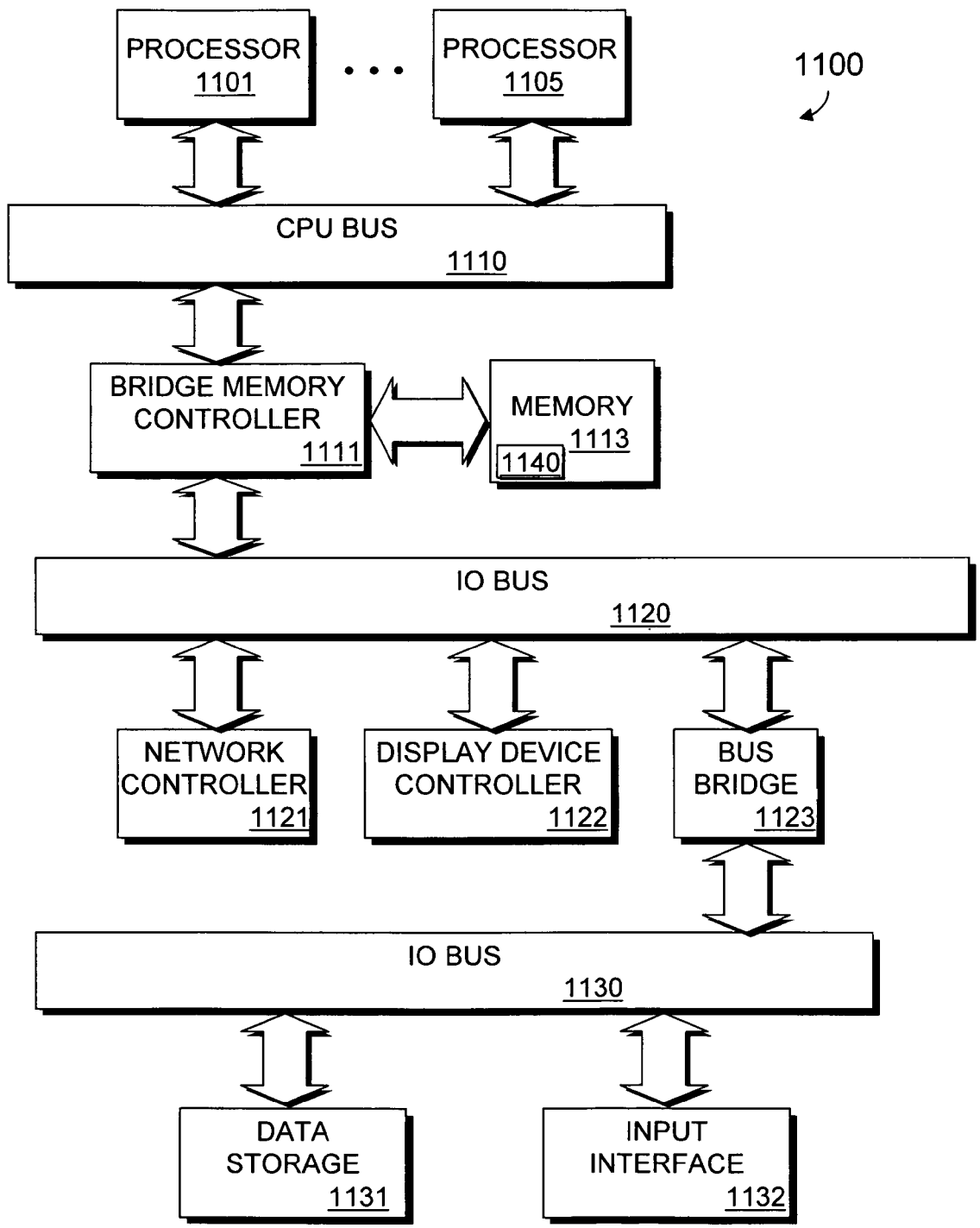
FIG. 11 illustrates a computer system for implementing a system designer according to an example embodiment of the present invention.

FIG. 11 is a block diagram of an exemplary computer system 1100 in which an example embodiment of the present invention resides. The computer system 1100 includes one or more processors that process data signals. As shown, the computer system 1100 includes a first processor 1101 and an nth processor 1105, where n may be any number. The processors 1101 and 1105 may be multi-core processors with multiple processor cores on each chip. The processors 1101 and 1105 are coupled to a CPU bus 1110 that transmits data signals between processors 1101 and 1105 and other components in the computer system 1100.

The computer system 1100 includes a memory 1113. The memory 1113 may store instructions and code represented by data signals that may be executed by the processor 1101. A bridge memory controller 1111 is coupled to the CPU bus 1110 and the memory 1113. The bridge memory controller 1111 directs data signals between the processor 1101, the memory 1113, and other components in the computer system 1100 and bridges the data signals between the CPU bus 1110, the memory 1113, and a first IO bus 1120.

The first IO bus 1120 may be a single bus or a combination of multiple buses. The first IO bus 1120 provides communication links between components in the computer system 1100. A network controller 1121 is coupled to the first IO bus 1120. The network controller 1121 may link the computer system 1100 to a network of computers (not shown) and supports communication among the machines. A display device controller 1122 is coupled to the first IO bus 1120. The display device controller 1122 allows coupling of a display device (not shown) to the computer system 1100 and acts as an interface between the display device and the computer system 1100.

A second IO bus 1130 may be a single bus or a combination of multiple buses. The second IO bus 1130 provides communication links between components in the computer system 1100. A data storage device 1131 is coupled to the second IO bus 1130. An input interface 1132 is coupled to the second IO bus 1130. The input interface 1132 allows coupling of an input device to the computer system 1100 and transmits data signals from an input device to the computer system 1100. A bus bridge 1123 couples the first IO bus 1120 to the second IO bus 1130. The bus bridge 1123 operates to buffer and bridge data signals between the first IO bus 1120 and the second IO bus 1130. It should be appreciated that computer systems having a different architecture may also be used to implement the computer system 1100.

A system designer 1140 may reside in memory 1113 and be executed by one or more of the processors 1101 and 1105. The system designer 1140 may operate to synthesize a system, place the system on a target device, and routing the system, where a plurality of synthesis runs may be performed on the design of the system where different settings are programmed in each of the synthesis runs. The synthesis runs may be performed using the processors 1101 and 1105, other processors, processor cores, or computer systems. In this embodiment, observer logic may be inserted at the initial stage of synthesis to mark and identify sections of logic and operate to provide a bounded region for the logic. Different settings may be programmed for the synthesis procedures in each synthesis run in order to generate unique cell netlists. The results in the unique cell netlists may be utilized to generate a merged cell netlist.

Figure 12:
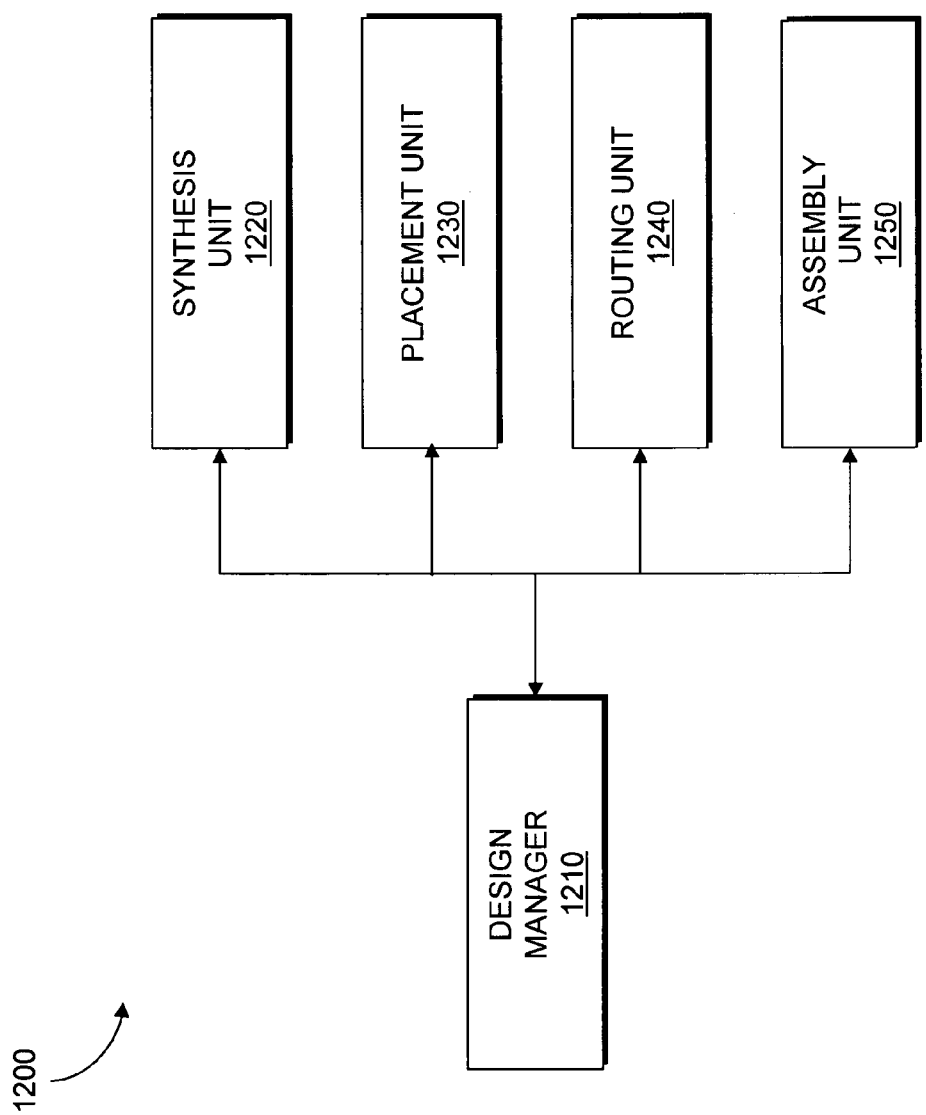
FIG. 12 illustrates a system designer according to an exemplary embodiment of the present invention.

FIG. 12 illustrates a system designer 1200 according to an embodiment of the present invention. The system designer 1200 may be an EDA tool for designing a system on a target device such as an FPGA or other circuitry. FIG. 12 illustrates modules implementing an embodiment of the system designer 1200. According to one embodiment, the modules represent software modules and system design may be performed by a computer system such as the one illustrated in FIG. 11 executing sequences of instructions represented by the modules shown in FIG. 12. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software. The system designer 1200 includes a designer manager 1210. The designer manager 1210 is connected to and transmits data between the components of the system designer 1200.

The system designer 1200 includes a synthesis unit 1220. The synthesis unit 1220 generates a cell netlist from a design of a system to be implemented on the target device. According to an embodiment of the system designer 1200, the synthesis unit 1220 takes a conceptual HDL design definition and generates an optimized logical representation of the system. The optimized logical representation of the system generated by the synthesis unit 1220 may include a representation that has a minimized number of functional blocks and registers, such as logic gates and logic elements, required for the system. Alternatively, the optimized logical representation of the system generated by the synthesis unit 1220 may include a representation that has a reduced depth of logic and that generates a lower signal propagation delay. The synthesis unit 1220 also determines how to implement the functional blocks and registers in the optimized logic representation utilizing resources such as cells on a target. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, IO elements or other components.

According to an embodiment of the present invention, a plurality of synthesis runs may be performed on the design of the system. The synthesis runs may be performed in parallel or serially. In this embodiment, the synthesis unit 1220 inserts observer logic at the initial stage of synthesis to mark and identify sections of logic and operate to provide a bounded region for the logic. Different settings may be programmed for the synthesis procedures in each synthesis run in order to generate unique cell netlists. The sections of logic associated with the observer logic of each of the plurality of cell netlists may be analyzed and compared with similar sections of logic from other synthesis runs. The synthesis unit 1220 identifies sections of logic with the best quality and selects these sections of logic to be included in a merged cell netlist.

The system designer 1200 includes a placement unit 1230 that performs placement. The placement unit 260 processes the merged cell netlist to produce a placement for each of the cells in the merged cell netlist.

The system designer 1200 includes a routing unit 1240 that performs routing. The routing unit 1240 determines the routing resources on the target device to use to provide interconnection between the components implementing functional blocks and registers of the logic design.

The system designer 1200 includes an assembly unit 1250 that performs an assembly procedure that creates a data file that includes the design of the system generated by the system designer 1200. The data file may be a bit stream that may be used to program the target device. The assembly unit 1250 may output the data file so that the data file may be stored or alternatively transmitted to a separate machine used to program the target device. It should be appreciated that the assembly unit 1250 may also output the design of the system in other forms such as on a display device or other medium.

FIG. 12 illustrates an exemplary block diagram of a system designer 1200. It should be appreciated that addition components may be implemented on the system designer 1200, that not all of the components illustrated are necessary to implement the system designer 1200, and that the illustrated components may be substituted with other components.

Figure 13:
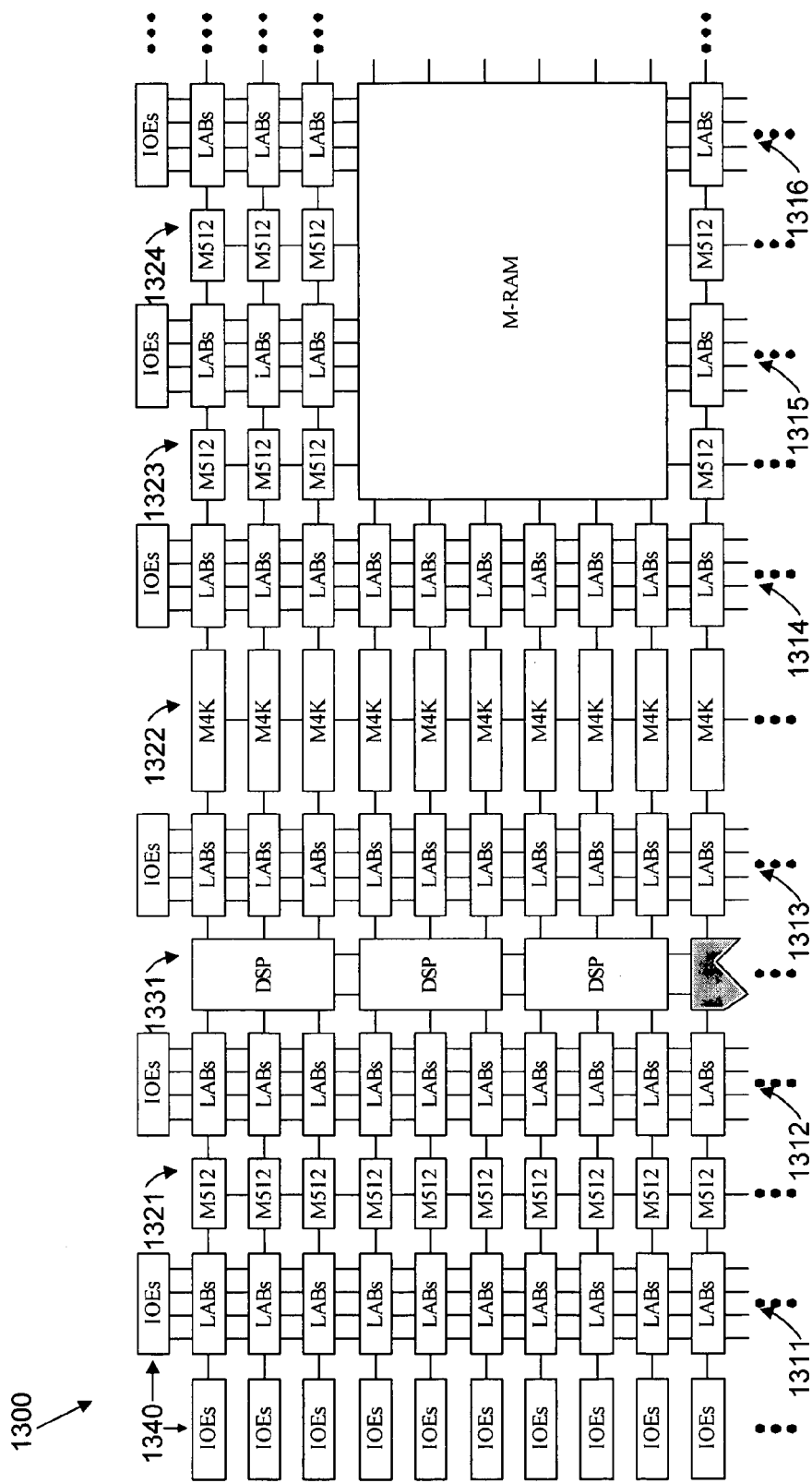
FIG. 13 illustrates an exemplary target device according to an exemplary embodiment of the present invention.

FIG. 13 illustrates an exemplary target device 1300 in which a system may be implemented on 1300 utilizing an FPGA according to an embodiment of the present invention. According to one embodiment, the target device 1300 is a chip having a hierarchical structure that may take advantage of wiring locality properties of circuits formed therein.

The target device 1300 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ II manufactured by Altera® Corporation. LABs are grouped into rows and columns across the target device 1300. Columns of LABs are shown as 1311-1316. It should be appreciated that the logic block may include additional or alternate components.

The target device 1300 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 300. Columns of memory blocks are shown as 1321-1324.

The target device 1300 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 1300 and are shown as 1331.

The target device 300 includes a plurality of input/output elements (IOEs) 1340. Each IOE feeds an I/O pin (not shown) on the target device 1300. The IOEs are located at the end of LAB rows and columns around the periphery of the target device 1300. Each IOE includes a bidirectional I/O buffer and a plurality of registers for registering input, output, and output-enable signals. When used with dedicated clocks, the registers provide performance and interface support with external memory devices.

The target device 1300 may include routing resources such as LAB local interconnect lines, row interconnect lines ("H-type wires"), and column interconnect lines ("V-type wires") (not shown) to route signals between components on the target device.

FIG. 13 illustrates an exemplary embodiment of a target device. It should be appreciated that a system may include a plurality of target devices, such as that illustrated in FIG. 13, cascaded together. It should also be appreciated that the target device may include programmable logic devices arranged in a manner different than that on the target device 1300. A target device may also include FPGA resources other than those described in reference to the target device 1300.

Figure 14:
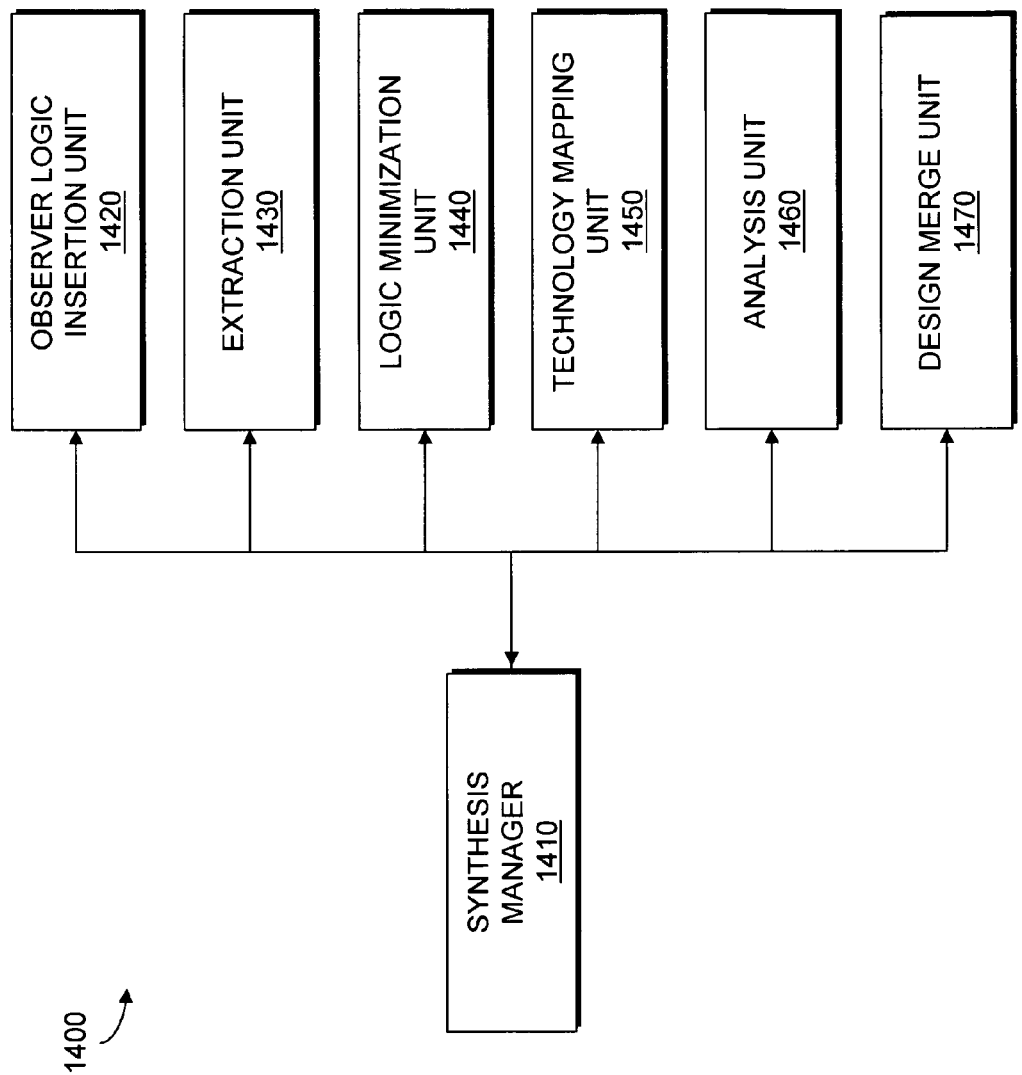
FIG. 14 illustrates a synthesis unit according to an exemplary embodiment of the present invention.

FIG. 14 illustrates a synthesis unit 1400 according to an exemplary embodiment of the present invention. The synthesis unit 1400 illustrated in FIG. 14 may be used to implement the synthesis unit 1220 illustrated in FIG. 12. The synthesis unit 1400 includes a synthesis manager 1400. The synthesis manager 1400 receives information from a designer such as settings to program various procedures performed. The synthesis manager also operates to transmit information between components in the synthesis unit 1400.

The synthesis unit 1400 includes an observer logic insertion unit 1420. The observer logic insertion unit 1420 inserts observer logic into a design for a system. According to an embodiment of the synthesis unit 1400, the observer logic may be implemented using special logic gates which remain undisturbed during synthesis. The observer logic operates to mark and identify sections of logic. The observer logic may function as an output pins to provide information about signals at a section of logic. According to an embodiment of the present invention, the observer logic insertion unit 1420 inserts observer logic at outputs of registers, memory blocks, multipliers, and other hard blocks. The observer logic may also be inserted on high fanout signals and on user hierarchy boundaries. The observer logic insertion unit 1420 may implement the procedure illustrated at FIG. 3.

The synthesis unit 1400 includes an extraction unit 1430. According to an embodiment of the synthesis unit 1400, the extraction unit 1430 translates a description of the design of the system into a netlist of logic. The translation may be performed on a Verilog or VHDL file that includes text. The netlist of logic may include a description of components such as logic gates that may be used to implement the design for the system.

The synthesis unit 1400 includes a logic minimization unit 1440. According to an embodiment of the synthesis unit, the logic minimization unit 1440 transforms the netlist of logic into a less complex gate level implementation. The minimized design may include a fewer number of gate inputs, gates, and/or level of logic gates, logic elements, and registers.

The synthesis unit 1400 includes a technology mapping unit 1450. According to an embodiment of the synthesis unit 1400, the technology mapping unit 1450 determines how to implement logic gates and logic elements in the optimized logic representation with resources available on the target device. The resources available on the target device may be referred to as "cells" or "components" and may include logic-array blocks, registers, memories, digital signal processing blocks, input output elements, and other components. The technology mapping unit 1450 generates an optimized technology-mapped netlist (cell netlist).

The synthesis unit 1400 includes an analysis unit 1460. According to an embodiment of the synthesis unit 1400, the analysis unit 1460 analyzes sections of logic associated with observer logic from a plurality of cell netlists and assigned a quality factor. The quality factor may be generated based upon a size of a section of logic, the speed in which signals are propagated through the section of logic, the amount of wire required for implementing the section of logic, and/or other criteria.

The synthesis unit 1400 includes a design merge unit 1470. According to an embodiment of the synthesis unit 1400, the design merge unit 1470 compares sections of logic in the design for the system with similar sections of logic from other synthesis runs. The sections of logic with the best quality are identified and selected to be included in a merged cell netlist.

FIGS. 1 through 5 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system to be implemented on a target device, the method comprising:
   performing a first synthesis run on an entire design of a system with a first setting to generate a first cell netlist for the entire design of the system;
   performing a second synthesis run on the entire design of the system with a second setting where the second synthesis is performed in parallel with the first synthesis to generate a second cell netlist for the entire design of the system; and
   generating a merged cell netlist that includes a first section of logic from the first netlist and a second section of logic from the second cell netlist, wherein at least one of the performings and generating is conducted using a processor.

2. The method of claim 1, wherein the first synthesis run includes logic minimization and technology mapping.

3. The method of claim 2, wherein the second synthesis run includes logic minimization and technology mapping.

4. The method of claim 1, wherein the first synthesis run comprises inserting observer logic into the design of the system to identify sections of logic in the design and to monitor data properties associated with the sections of logic.

5. The method of claim 4, wherein the observer logic is inserted at outputs of registers.

6. The method of claim 4, wherein the observer logic is inserted at outputs of memory blocks.

7. The method of claim 4, wherein the observer logic is inserted at outputs of multipliers.

8. The method of claim 4, wherein the observer logic is inserted on high fanout signals.

9. The method of claim 4, wherein the observer logic is inserted on user hierarchy boundaries.

10. The method of claim 1, further comprising generating a quality factor for each section of logic in the first cell net list and the second cell netlist.

11. The method of claim 10, wherein the quality factor may be based on a delay through a section of logic.

12. The method of claim 10, wherein the quality factor may be based on a number of resources on the target device used to implement a section of logic.

13. The method of claim 10, wherein the quality factor may be based on a number of wires use to implement a section of logic.

14. The method of claim 10, wherein the first section of logic from the first cell netlist and the section of logic from the second cell netlist are selected for the merged cell netlist based upon their corresponding quality factors.

15. The method of claim 1, wherein the first synthesis run is performed by a first processor and the second synthesis run is performed by a second processor.

16. The method of claim 1, wherein performing the first synthesis run with the first setting includes encoding a state machine using a first technique and performing the second synthesis run with the second setting includes encoding the state machine using a second technique.

17. The method of claim 1, wherein performing the first synthesis run with the first setting includes performing register retiming and performing the second synthesis run with the second setting includes performing synthesis without performing register retiming.

18. The method of claim 1, wherein performing the first synthesis run with the first setting includes honoring classes of user buffers and performing the second synthesis run with the second setting includes ignoring the classes of user buffers.

19. The method of claim 1, wherein performing the first synthesis run with the first setting includes using a first lookup table mapping cost function that emphasizes speed and performing the second synthesis run with the second setting includes using a second lookup table mapping cost function that emphasizes area.

20. A non-transitory computer readable medium including sequences of instructions stored thereon for causing a computer to execute a method, the method comprising:
   performing a first synthesis run on an entire design of a system with a first setting to generate a first cell netlist for the entire design of the system;
   performing a second synthesis run on the entire design of the system with a second setting where the second synthesis is performed in parallel with the first synthesis to generate a second cell netlist for the entire design of the system; and
   generating a merged cell netlist that includes a first section of logic from the first netlist and a second section of logic from the second cell netlist, wherein at least one of the performings and generating is conducted using a processor.

21. The non-transitory computer readable medium of claim 20, wherein the first synthesis run includes logic minimization and technology mapping.

22. The non-transitory computer readable medium of claim 21, wherein the second synthesis run includes logic minimization and technology mapping.

23. The non-transitory computer readable medium of claim 20, wherein the first synthesis run comprises inserting observer logic into the design of the system to identify sections of logic in the design and to monitor data properties associated with the sections of logic.

24. The non-transitory computer readable medium of claim 23, wherein the observer logic is inserted at outputs of registers.

25. The non-transitory computer readable medium of claim 23, wherein the observer logic is inserted at outputs of memory blocks.

26. The non-transitory computer readable medium of claim 23, wherein the observer logic is inserted at outputs of multipliers.

27. The non-transitory computer readable medium of claim 20, further comprising generating a quality factor for each section of logic in the first cell net list and the second cell netlist.

28. The non-transitory computer readable medium of claim 27, wherein the quality factor may be based on a delay through a section of logic.

29. The non-transitory computer readable medium of claim 27, wherein the quality factor may be based on a number of resources on the target device used to implement a section of logic.

30. The non-transitory computer readable medium of claim 27, wherein the quality factor may be based on a number of wires use to implement a section of logic.

31. The non-transitory computer readable medium of claim 27, wherein the first section of logic from the first cell netlist and the section of logic from the second cell netlist are selected for the merged cell netlist based upon their corresponding quality factors.

32. A synthesis unit, comprising:
a synthesis manager operable to perform a first synthesis run on an entire design of a system with a first setting to generate a first cell netlist for the entire design of the system, and operable to perform a second synthesis run on the entire design of the system with a second setting where the second synthesis is performed in parallel with the first synthesis to generate a second cell netlist for the entire design of the system; and
a design merge unit operable to generate a merged cell netlist that includes a first section of logic from the first netlist and a second section of logic from the second cell netlist, wherein at least one of the synthesis manager and design merge unit is implemented using a processor.

33. The synthesis unit of claim 32, wherein the first synthesis run includes logic minimization and technology mapping.

34. The synthesis unit of claim 32, wherein the second synthesis run includes logic minimization and technology mapping.

35. The synthesis unit of claim 32, wherein the first synthesis run comprises inserting observer logic into the design of the system to identify sections of logic in the design and to monitor data properties associated with the sections of logic.

36. The synthesis unit of claim 35, wherein the observer logic is inserted at outputs of registers.

37. The synthesis unit of claim 35, wherein the observer logic is inserted at outputs of memory blocks.

* * * * *